(12) United States Patent
Ling et al.

(10) Patent No.: US 10,339,201 B1
(45) Date of Patent: *Jul. 2, 2019

(54) DOT PRODUCT BASED PROCESSING ELEMENTS

(71) Applicant: Altera Corporation, San Jose, CA (US)

(72) Inventors: Andrew Chaang Ling, Toronto (CA); Davor Capalija, Etobicoke (CA); Tomasz Sebastian Czajkowski, Toronto (CA); Andrei Mihai Hagiescu Miriste, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,431

(22) Filed: Aug. 13, 2018

Related U.S. Application Data

(63) Continuation of application No. 15/266,192, filed on Sep. 15, 2016, now Pat. No. 10,049,082.

(51) Int. Cl.
   *G06F 7/16* (2006.01)
   *G06F 17/16* (2006.01)
   *H01L 27/02* (2006.01)
   *H01L 21/66* (2006.01)

(52) U.S. Cl.
   CPC .............. *G06F 17/16* (2013.01); *H01L 22/34* (2013.01); *H01L 27/0207* (2013.01)

(58) Field of Classification Search
   CPC ...... G06F 17/16; H01L 22/34; H01L 27/0207
   USPC ......................................................... 708/607
   See application file for complete search history.

(56) References Cited

U.S. PATENT DOCUMENTS

| | | | |
|---|---|---|---|
| 5,081,573 | A | 1/1992 | Hall et al. |
| 5,311,459 | A | 5/1994 | D'Luna et al. |
| 6,891,538 | B1 | 5/2005 | Tannenbaum |
| 8,521,800 | B1 | 8/2013 | Bergland |
| 8,959,136 | B1 | 2/2015 | Cheung et al. |
| 9,600,278 | B1 | 3/2017 | Langhammer |
| 2004/0117422 | A1 | 6/2004 | Debes et al. |
| 2005/0144212 | A1 | 6/2005 | Simkins et al. |
| 2005/0240646 | A1 | 10/2005 | Lin |
| 2006/0195496 | A1 | 8/2006 | Vadi et al. |
| 2008/0071851 | A1 | 3/2008 | Zohar et al. |

FOREIGN PATENT DOCUMENTS

WO   WO2009035774 A1   3/2009

OTHER PUBLICATIONS

PCT International Search Report & Written Opinion for PCT Application No. PCT/US2017/050989 dated Dec. 20, 2017; 15 Pages.

*Primary Examiner* — Tan V Mai
(74) *Attorney, Agent, or Firm* — Fletcher Yoder, P.C.

(57) ABSTRACT

Systems and methods for calculating a dot product using digital signal processing units that are organized into a dot product processing unit for dot product processing using multipliers and adders of the digital signal processing units.

26 Claims, 7 Drawing Sheets

US 10,339,201 B1

DOT PRODUCT BASED PROCESSING ELEMENTS

CROSS REFERENCE TO RELATED APPLICATIONS

This application is a continuation of U.S. application Ser. No. 15/266,192, filed Sep. 15, 2016 (published as US 2018-0074996 and to issue as U.S. Pat. No. 10,049,082), the contents of which is herein expressly incorporated by reference for all purposes.

BACKGROUND

The present disclosure relates generally to integrated circuits, such as field programmable gate arrays (FPGAs). More particularly, the present disclosure relates to dot-product processing implemented on an integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Vector dot product processing is often used in digital signal processing algorithms (e.g., audio/video codecs, video or audio processing, etc.). When implementing digital signal processors (DSPs) on integrated circuit devices, including reconfigurable devices such as field programmable gate arrays (FPGAs), physical area and speed of dot product processing structure are factors to ensure that the integrated circuit device is both suitable in size and speed for the task to be performed. However, the dot product computations may utilize individual DSPs and memory resources for each function that increase route length thereby possibly increasing area and performance as well.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of dot product processing using reconfigurable devices, such as field programmable gate arrays (FPGAs). Specifically, a macro of a coarsened dot product processing unit may be used to efficiently take advantage of space in a reconfigurable device while ensuring satisfactory performance. Furthermore, by organizing the reconfigurable device into a unit that performs the dot product processing without using more general routing paths that may be used in integrated circuits where different digital signal processing blocks are used disparately with potential for numerous long paths that negatively effect performance of the integrated circuit.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
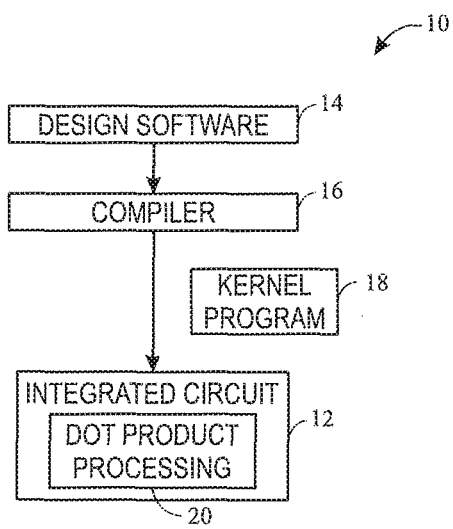
FIG. 1 is a block diagram of a system that utilizes dot product processing, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure describes a technique to use enhanced dot-product processing elements (PEs) on integrated circuits, including reconfigurable devices. This resulting PE architecture is well suited for associative computation such as matrix multiplies or convolutions, and can be chained together to implement systolic arrays. The technique also is based on coarsening the dot-product to larger sizes, which yields more efficient resource utilization. The technique also assists in an overall computer aided design (CAD) flow, since a coarsened dot-product may be placed as a large macro with less atoms to be placed and routes to be formed. The coarsening technique supports data interleaving techniques to enable heavy pipelining and caching for data reuse. Coarsening also improves mapping of the dot-product to reduce a total number of digital signal processing (DSP) units used. Moreover, depending on a matrix size to be implemented, the dot-product coarsened size may be adjusted to yield efficient results based at least in part on the matrix size. For example, a DSP unit may be included for each element in a vector of the matrix being dot-processed. Specifically, in some embodiments, a four-vector dot product may be implemented using a dot product processing macro that includes four DSP units in a column in a single macro to implement the dot product processing of the four-vectors.

Specifically, the dot product PE utilizes an adder tree and multiplication inputs to yield an efficient dot product computation. Coarsening the dot product reduces resource requirements, since dedicated high-speed routes between adjacent DSPs can be leveraged. Coarsening the dot product also may simplify the placement and routing problem, since dot-product may be placed as a large contiguous block thereby reducing the number of placement objects and general purpose routes. While the techniques of this disclosure are described chiefly in the context of reconfigurable devices, such as programmable logic devices with field programmable gate array (FPGA) fabric, this is meant to illustrative and not limiting. Indeed, the dot-product circuitry of this disclosure may be implemented in other integrated circuits. Other types of integrated circuits, such as applicant-specific integrated circuits (ASICs), microprocessors, memory devices, transceivers, and the like, may also use the dot-product circuitry of this disclosure.

With the foregoing in mind, FIG. 1 illustrates a block diagram of a system 10 that includes dot product processing operations that may reduce a logical area and/or increase a speed that is typically used for such an implementation. As discussed above, a designer may desire to implement functionality on an integrated circuit, such as a reconfigurable integrated circuit 12, such as a field programmable gate array (FPGA). The designer may implement a circuit design to be programmed onto the IC 12 using design software 14, such as a version of Quartus by Altera™. The design software 14 may use a compiler 16 to generate a low-level circuit-design kernel program 18, sometimes known as a program object file or bitstream, that programs the integrated circuit 12. That is, the compiler 16 may provide machine-readable instructions representative of the circuit design to the IC 12. For example, the IC 12 may receive one or more kernel programs 18 that describe the hardware implementations that should be stored in the IC. In some embodiments, dot-product processing operations 20 may be implemented on the integrated circuit 12. For example, the dot-product processing operations 20 may be used to operate on as single-precision floating-point numbers, double-precision floating-point numbers, or other suitable objects for dot-product processing. As will be described in more detail below, the dot-product processing operations 20 may coarsened into a large macro that may be inserted into a design using lower numbers of general routing resources (or non-DSP block resources). For example, two DSP blocks for single-precision floating-point addition may be combined as discussed below to form a double-precision floating-point adder.

Figure 2:
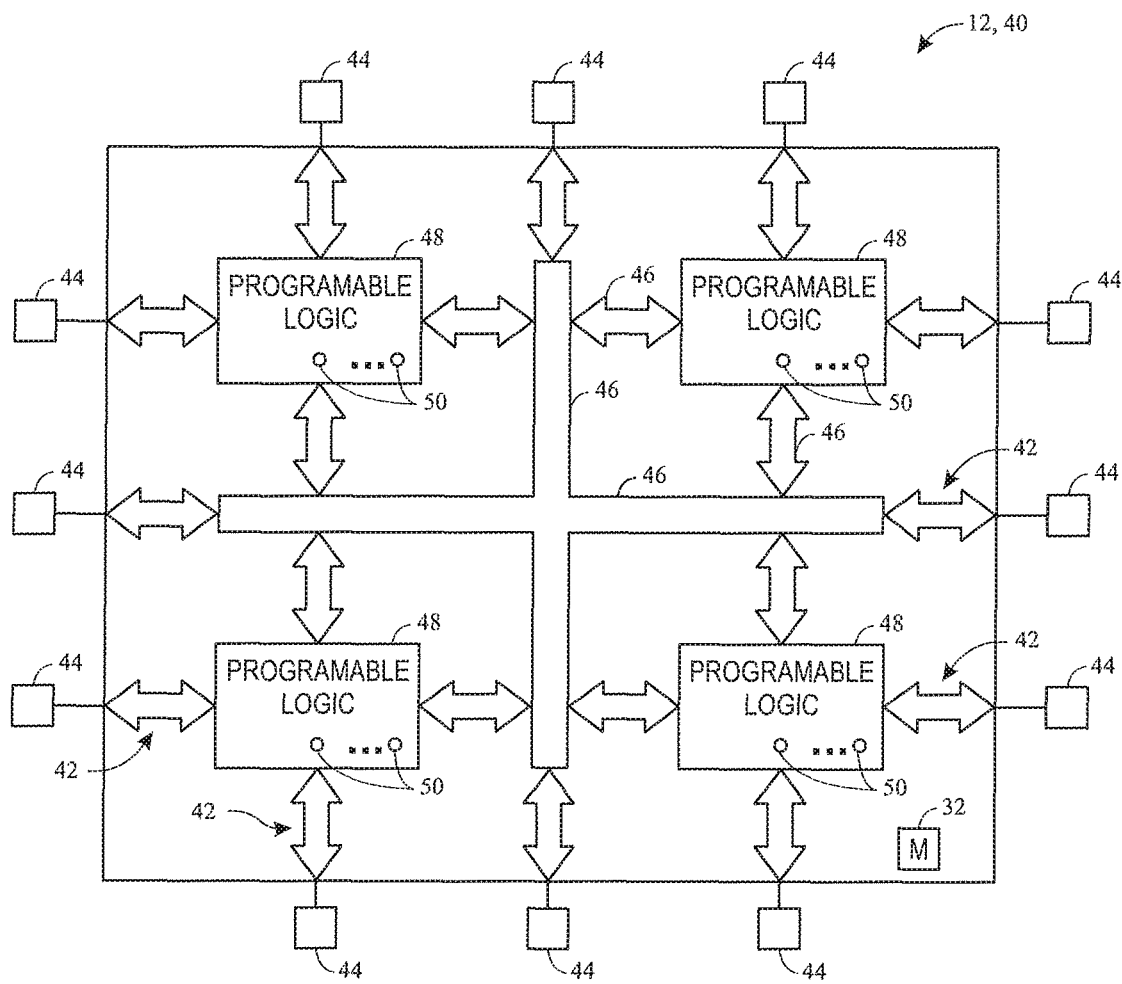
FIG. 2 is a block diagram of a programmable logic device that may include logic useful for implementing dot product processing, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of reconfigurable device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may include one or more logic elements (wires, gates, registers, etc.). For example, during programming, configuration data is loaded into the memory 52 using pins 44 and input/output circuitry 42. In some embodiments, the memory 52 may be implemented as random-access-memory (RAM) cells. The use of memory 52 based on RAM technology is described herein is intended to be only one example. Moreover, memory 52 may be distributed (e.g., as RAM cells) throughout the device 40. Further, because these RAM cells are loaded with configuration data during programming, they are sometimes referred to as configuration RAM cells (CRAM). The memory 52 may provide a corresponding static control output signal that controls the state of an associated logic component in programmable logic 48. For instance, in some embodiments, the output signals may be applied to the gates of metal-oxide-semiconductor (MOS) transistors within the programmable logic 48. In some embodiments, the programmable elements 50 may include DSP blocks that implement common operations, such as dot product processing elements implemented using DSP blocks.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, some device arrangements may use logic that is arranged in a manner other than rows and columns.

As discussed above, the FPGA 40 may allow a designer to create a customized design capable of executing and performing customized functionalities. Each design may have its own hardware implementation to be implemented on the FPGA 40. These hardware implementations may include floating-point operations using the DSP blocks of the programmable elements 50.

A dot product may be defined algebraically as the sum of the products of the corresponding entries in the vectors undergoing the dot product calculation. For example, Equation 1 illustrates a dot product expression of two 4-vector dot product algebraically:

$$\vec{A} \cdot \vec{B} = [A_1, A_2, A_3, A_4] \cdot \begin{bmatrix} B_1 \\ B_2 \\ B_3 \\ B_4 \end{bmatrix} = \quad \text{(Equation 1)}$$

$$A_1 B_1 + A_2 B_2 + A_3 B_3 + A_4 B_4$$

where $A_1$, $A_2$, $A_3$, and $A_4$ are elements in the A vector, and $B_1$, $B_2$, $B_3$, and $B_4$ are elements in the B vector. For example, the elements in the A vector may correspond to a timelike element and three spacelike elements. The elements in the B vector may be another vector, some scaling values, equivalent to the A vector elements, or some other operations, such Lorentz transformations.

Figure 3:
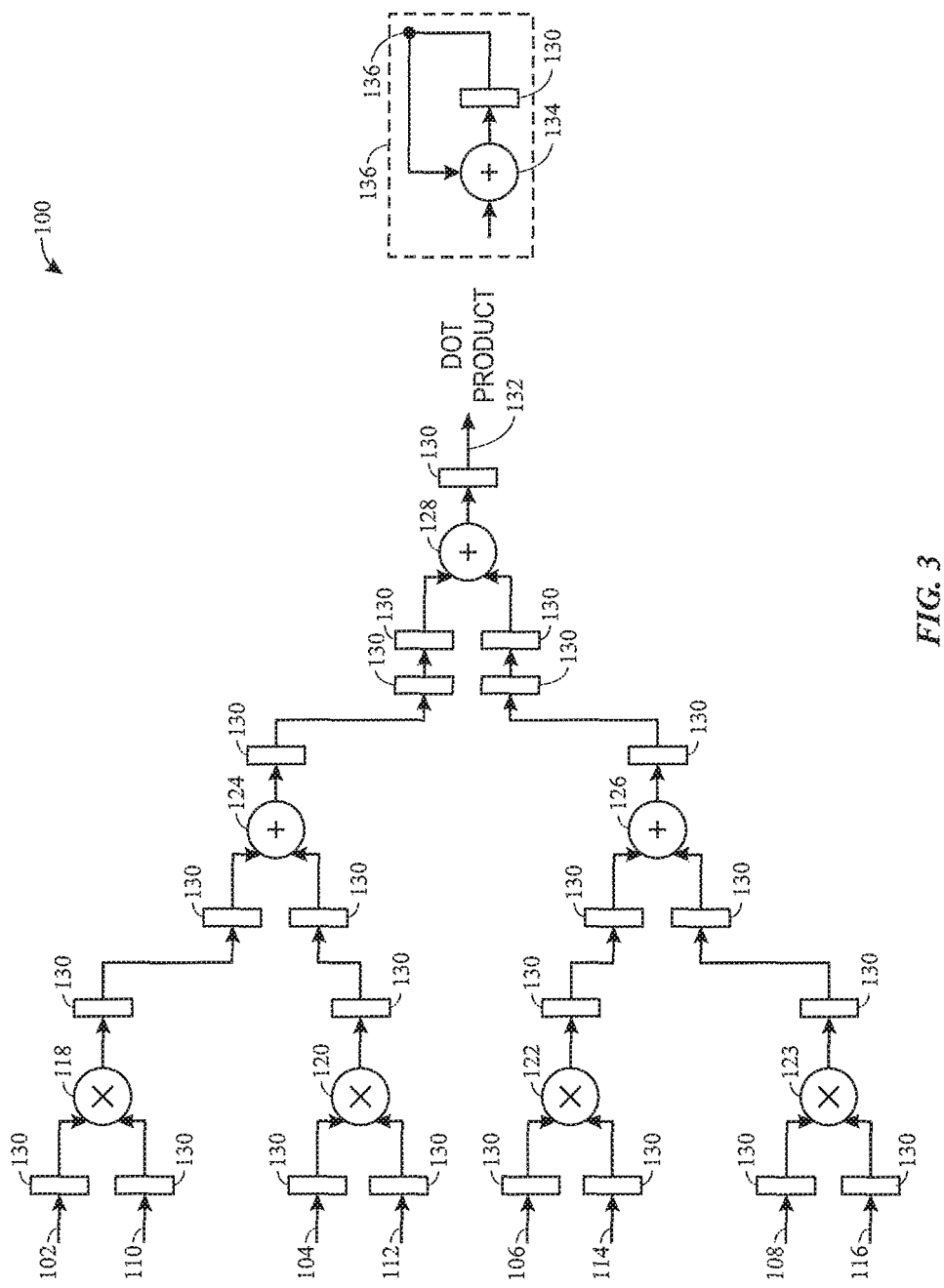
FIG. 3 is a block diagram illustrating a dot product processing circuit, in accordance with an embodiment.

FIG. 3 illustrates a 4-vector dot product circuit 100. A first vector is submitted to the circuit 100 as its constituent elements 102, 104, 106, and 108, and a second vector is submitted as its constituent set of elements 110, 112, 114, and 116 dot-product with the first vector. The second set of elements 110, 112, 114, and 116 may be different values or may be the same value. For example, the second set of elements 110, 112, 114, and 116 may be a second four vector. Each pair of corresponding elements is submitted to respective multiplier that multiply the elements together. Specifically, elements 102 and 110 are multiplied together in a multiplier 118 to form a product; elements 104 and 112 are multiplied together in a multiplier 120 to form a product; elements 106 and 114 are multiplied together in a multiplier 122 to form a product; and elements 108 and 116 are multiplied together in a multiplier 124 to form a product. The products are then added together. In some embodiments, the products may be added together in a single 4-input adder. Additionally or alternatively, the products may be added together using a sequential addition that reduces a number of products by half in each round of addition, which may continue until a total sum is found that indicates the cross-product of the first vector and the second vector. For example, the product of elements 102 and 110 and the product of elements 104 and 112 are added together in an adder 124; the product of the elements 106 and 114 and the product of elements 108 and 116 are added together in an adder 126. The sums from the adders 124 and 126 are then added together in another adder 128. In some embodiments, the circuit 100 includes registers 130 that are used to ensure that the respective portions of the dot product calculations are substantially synchronized in processing. The registers 130 also ensure that the data being calculated is transferred properly. The output of the adder 128 is a dot product 132.

In some embodiments, the dot product 132 may be submitted to an accumulator 133 to form a running sum. The accumulator 133 includes an adder 134 that adds in a recent dot product with a running total 136. In other words, the accumulator 133 receives a dot product and adds it to all previous dot products so that a running total of dot products may be calculated.

Figure 4:
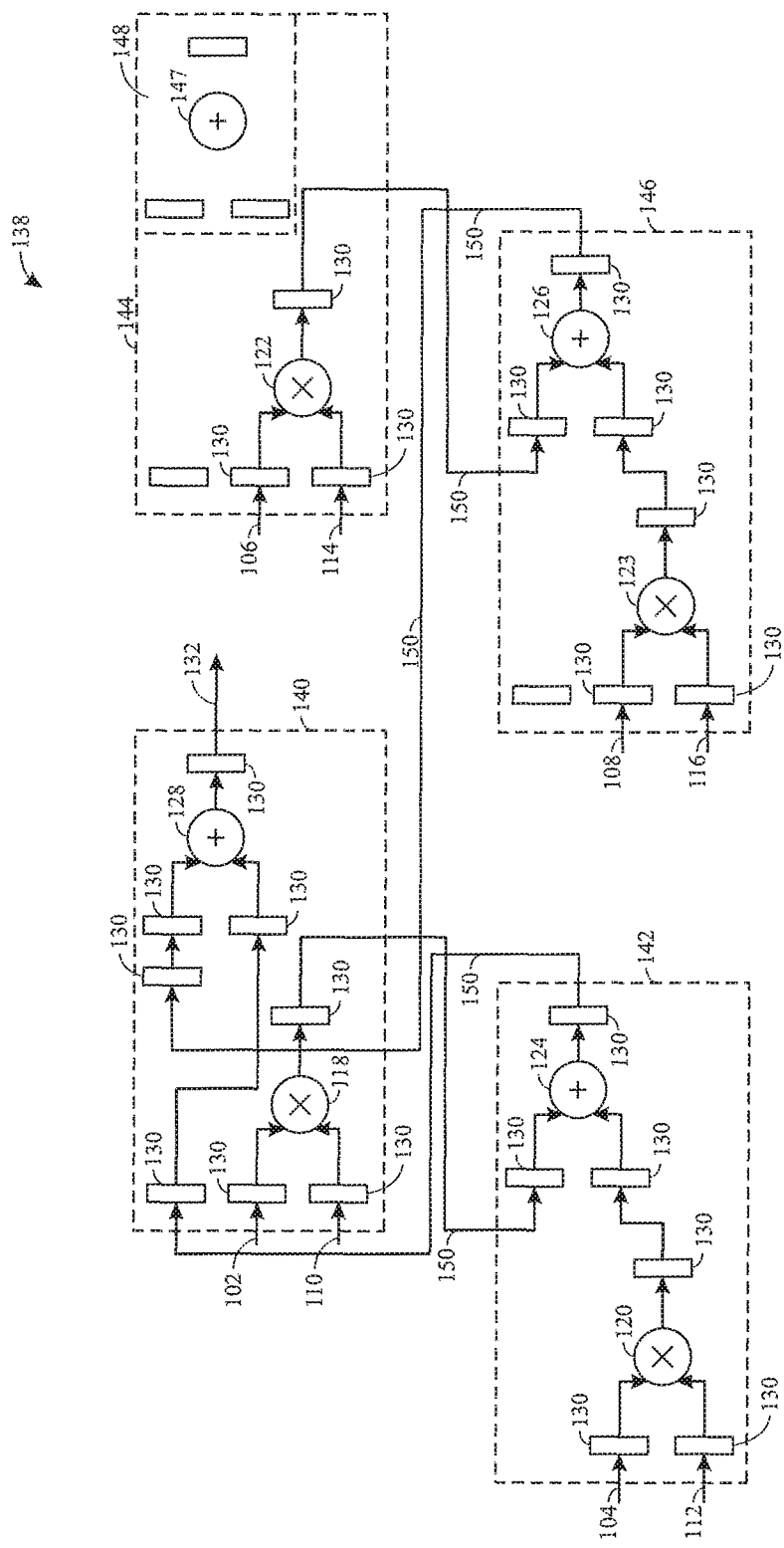
FIG. 4 is a block diagram illustrating the dot product processing circuit of FIG. 3 implemented using individual digital signal processing units, in accordance with an embodiment.

FIG. 4 illustrates a circuit 138 that may be used to implement the dot product circuit 100 of FIG. 3 in a reconfigurable device using digital signal processing (DSP) blocks 140, 142, 144, and 146. As illustrated, each of the DSP blocks 140, 142, 144, and 146 includes an adder (e.g., adders 124, 126, 128, and 137) and a multiplier (e.g., multipliers 118, 120, 122, and 123) that are routed in a way that provides 4-vector dot product processing. As illustrated, a portion (e.g., portion 148) of one or more DSP blocks (e.g., DSP block 144) remains unused. Furthermore, a routing 150 between the DSP blocks 140, 142, 144, and 146 may be long in relation to routes inside the DSP blocks 140, 142, 144, and 146. This may be due to placement of the DSP blocks 140, 142, 144, and 146 in relatively disparate locations within the IC 12. Such routing may result in decreased performance of the dot product calculations using the circuitry 138. To reduce such routing, the dot product processing may be coarsened into a relatively large macro, also referred to as an atom, that may be designed into the reconfigurable device to reduce routing between DSP blocks.

Figure 5:
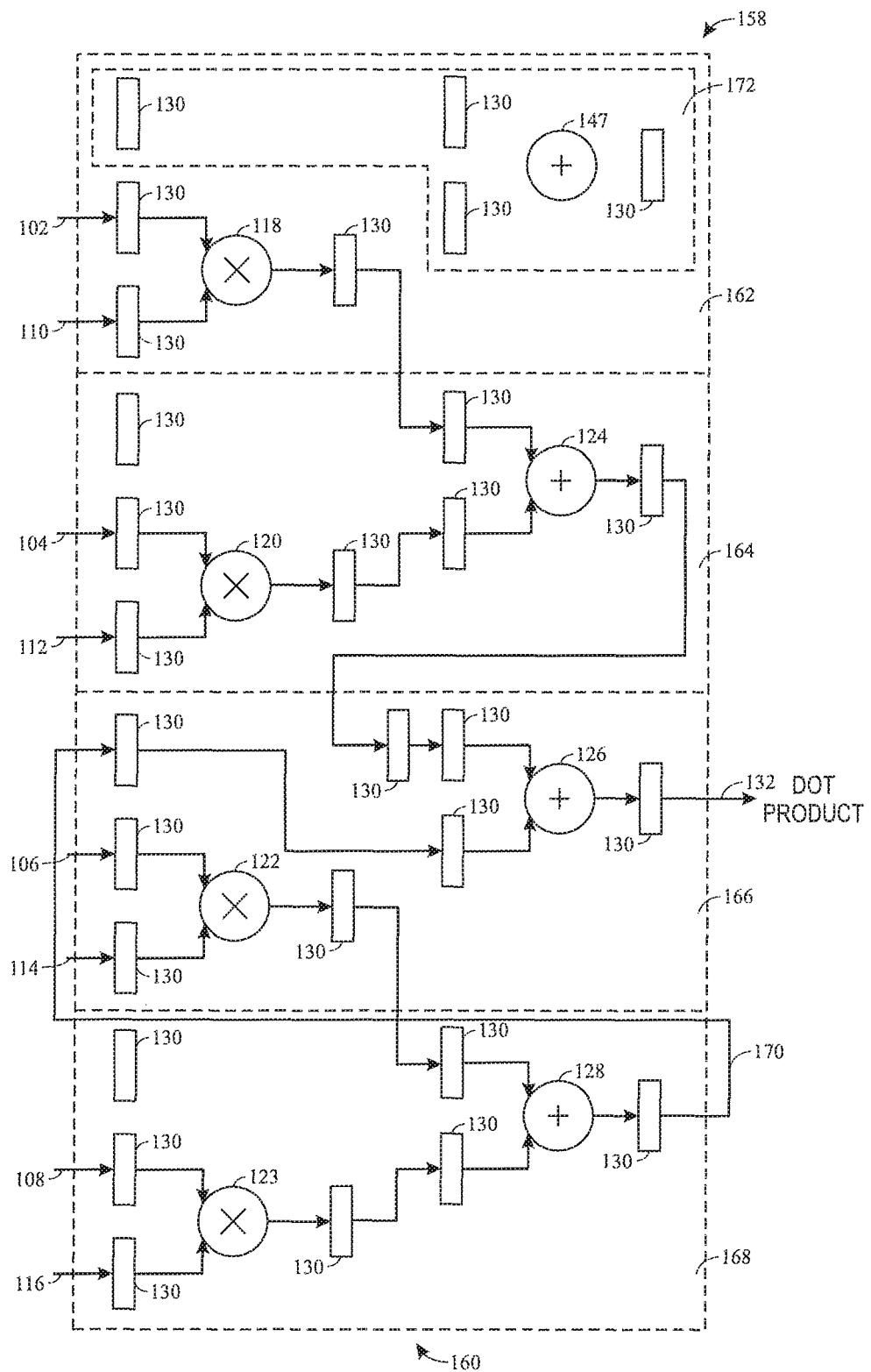
FIG. 5 is a block diagram illustrating the dot product processing circuit of FIG. 3 implemented using a coarsened dot product processing unit, in accordance with an embodiment.

FIG. 5 illustrates a circuit 158 that includes a coarsened 4-vector dot product processing macro that may be added to an integrated circuit such as a reconfigurable device. The circuit 158 includes all calculations of the circuit 100. However, as opposed to the circuit 138, the circuit 158 includes a DSP column 160 includes DSP blocks 162, 164, 166, and 168. The DSP blocks 162, 164, 166, and 168 are located in the DSP column 160 to reduce inter-DSP block routing using general routing in the reconfigurable device, thereby increasing device performance and/or area consumption. Specifically, the circuit 158 includes only a single general route 170. Similar to the DSP blocks 140, 142, 144, and 146, each of the DSP blocks 162, 164, 166, and 168 includes an adder and a multiplier. In the particular embodiment of the 4-element vector dot product illustrated in FIG. 5, a portion 172 of the DSP block 162 is unused.

Figure 6:
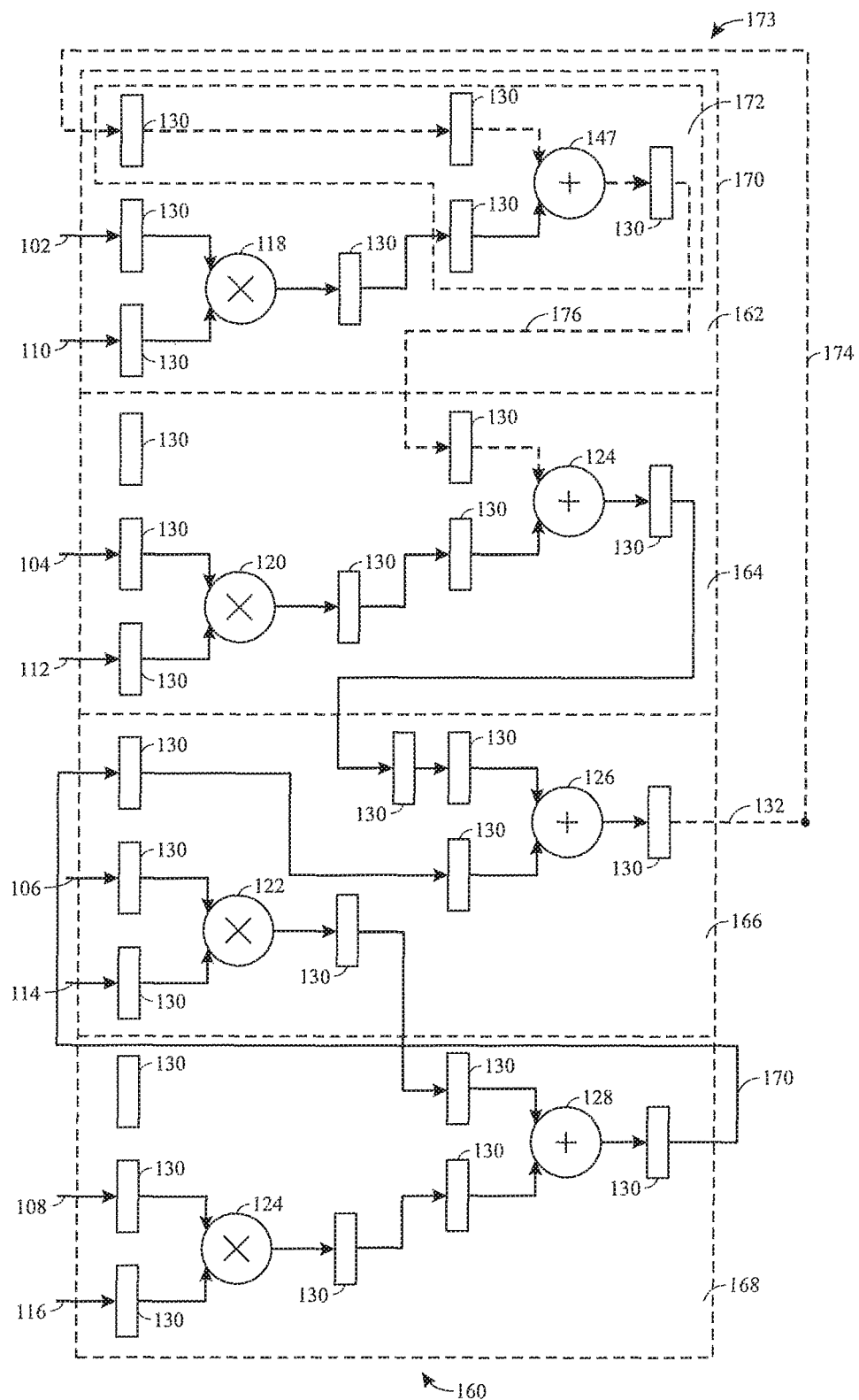
FIG. 6 is a block diagram illustrating the dot product processing circuit of FIG. 5 with an accumulator configured to create a running sum of dot products, in accordance with an embodiment.

In some embodiments, this portion 172 may be used for calculations outside of simple 4-vector dot product calculations. For example, FIG. 6 illustrates a circuit 173 that utilizes the portion 172 to implement an accumulator to find a running sum of dot products. Specifically, the adder 147 is used to add a previous dot product 132 to a product of the elements 102 and 110 via accumulator route 174. This sum of the previous dot product 132 is then added with the product of elements 104 and 112. This additional summation adds one more degree of latency in exchange for the running total.

Figure 7:
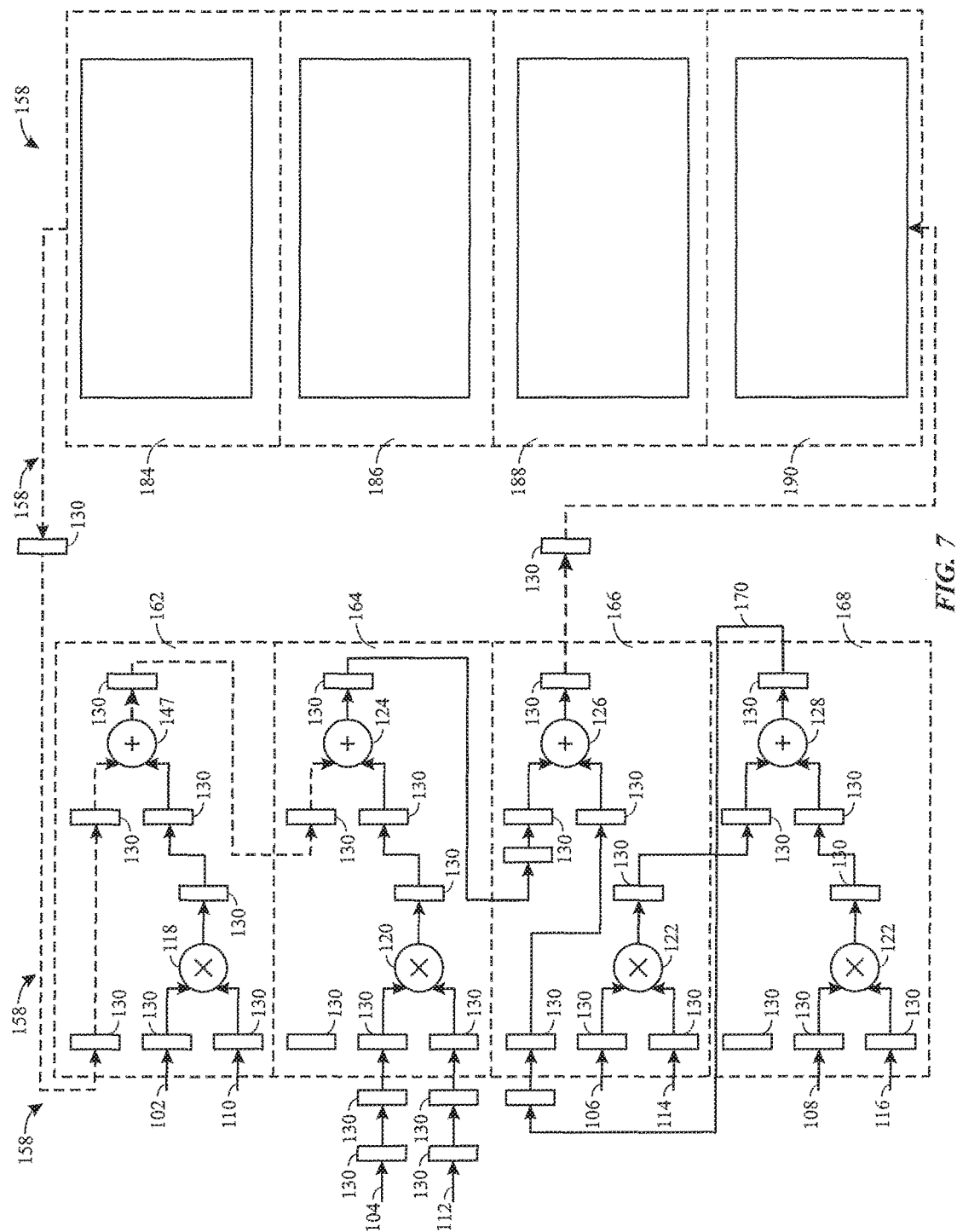
FIG. 7 is a block diagram illustrating the dot product processing circuit of FIG. 5 with a memory cache, in accordance with an embodiment.

FIG. 7 illustrates a cache accumulator circuit 178 that includes an accumulator cache 180 that stores previous dot products. The accumulator cache 180 includes a memory column 182. The memory column 182 includes multiple memory blocks 184, 186, 188, and 190 collectively referred to as memory blocks 184-190. The memory blocks 184-190 may include any suitable memory blocks, such as M20K memory blocks by Altera® Corporation. The memory blocks 184-190 may store a relatively large amount of sums. For example, the memory blocks 184-190 may store any exponent of two running sums, such as 128, 256, 512, 1024, 2048, etc. Each sum may increase latency of the circuit 178 over latency of the circuit 158 of FIG. 5 in exchange for the extra summations corresponding to previous dot products. For example, storing 2048 sums may increase latency by 2048.

Figure 8:
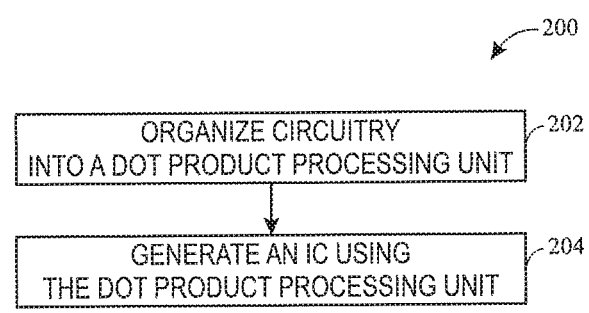
FIG. 8 is a process for calculating a dot product using a coarsened dot product processing unit, in accordance with an embodiment.

FIG. 8 illustrates a process 200 for calculating a dot product using an integrated circuit. The process 200 includes organizing circuitry into a dot product processing unit for dot product processing (block 202). The dot product processing unit includes two or more digital signal processing blocks to reduce an amount of general purpose routing used in the dot product processing if using individual digital signal processing blocks. The dot product processing unit is a coarsened dot product process that includes a number of digital signal processing units based on size of a matrix (or individual vectors) that are being processed using dot products. For example, four digital signal processing units may be included for a four vector (i.e., a vector with four constituent elements), and eight digital signal processing units may be included for an eight vector. This dot product processing unit may be used in generation of an integrated circuit (block 204), which may include programming a programmable logic device or an ASIC, for example. As previously discussed, the coarsened dot product processing enables use of less general routing than individually used digital signal processing units separately configured since more routes and longer routes are used in the individually used digital signal processing units. In other words, by creating a single chunk that may be sized according to dot product matrix sizes, the performance of the integrated circuit device implementing the dot product processing may be increased.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An electronic device comprising:
a plurality of digital signal processing units that are configurably connected to perform a variety of operations and that are configured to function together to output a dot product, wherein at least one of the plurality of digital signal processing units comprises:
a plurality of input ports to receive a plurality of inputs at the respective digital signal processing unit;
a multiplier to generate a product based at least in part on the plurality of inputs;
a dedicated route to transmit the product to or receive an output from another digital signal processing unit of the plurality of digital signal processing units; and
an adder to add the product with the output of a multiplier of the other digital signal processing unit of the plurality of digital signal processing units, wherein the dot product is based at least in part on an output of the adder.

2. The electronic device of claim 1, wherein a number of digital signal processing units utilized to output the dot product corresponds to a size of a matrix being processed.

3. The electronic device of claim 2, wherein the number of digital signal processing units is based at least in part on a number of elements to be processed in a dimension of the matrix.

4. The electronic device of claim 3, wherein the number of elements comprises a number of objects in a vector of the matrix.

5. The electronic device of claim 1, wherein at least one of the plurality of digital signal processing units comprises:
the dedicated route to receive the product from a first digital signal processing unit that abuts to the at least one digital signal processing unit; and
an additional dedicated route to transmit an additional product to a second digital signal processing unit, wherein the second digital signal processing unit abuts to the at least one digital signal processing unit.

6. The electronic device of claim 1, wherein the plurality of digital signal processing units are arranged in a column of digital signal processing blocks.

7. The electronic device of claim 1, wherein a second digital processing unit of the plurality of digital processing units comprises:
a second plurality of input ports configured to receive a second plurality of inputs;
a second multiplier to generate a second product based at least in part on the second plurality of inputs; and
a second dedicated route to transmit the second product to the at least one of the plurality of digital signal processing units via the dedicated route.

8. The electronic device of claim 7, wherein the second digital processing unit comprises an adder that does not increase the second product before the second product is output from the second dedicated route.

9. The electronic device of claim 1, wherein a second digital processing unit of the plurality of digital signal processing units comprises:
a second plurality of input ports configured to receive a second plurality of inputs;
a second multiplier to generate a second product based at least in part on the second plurality of inputs;
a second dedicated route to receive one or more products via the dedicated route of the one or more digital signal processing units; and
a second adder to add the one or more products together to form the dot product.

10. The electronic device of claim 9, wherein the second digital processing unit comprises an output to output the dot product from the plurality of digital processing units.

11. An electronic device comprising:
a first digital signal processing unit comprising:
a first plurality of input ports configured to receive a plurality of inputs; and
a first multiplier to generate a first product based at least in part on the first plurality of inputs;
a second digital signal processing unit comprising:

a second plurality of input ports configured to receive a second plurality of inputs;
a second multiplier to generate a second product based at least in part on the second plurality of inputs; and
a first adder to add the first and second products together to form an intermediate sum;
a first hardwired route to transmit the first product from the first digital signal processing unit to the second digital signal processing unit;
a third digital signal processing unit comprising:
a third plurality of input ports configured to receive a third plurality of inputs;
a third multiplier to generate a third product based at least in part on the second plurality of inputs; and
a second adder to generate a dot product based at least in part on the intermediate sum and the third product, wherein the first, second, and third digital signal processing units are configurably connected to perform a variety of operations including calculating the dot product; and
a second hardwired route to transmit the second product from the second digital signal processing unit to the third digital signal processing unit.

12. The electronic device of claim 11, wherein the first, second, and third digital signal processing unit are arranged in a column of digital signal processing unit.

13. The electronic device of claim 11, wherein a number of digital signal processing units utilized to output the dot product corresponds to a size of matrix being processed.

14. The electronic device of claim 13, wherein the number of digital signal processing units is based on an amount of vectors to be calculated.

15. The electronic device of claim 11, wherein the first digital signal processing unit comprises a third adder that does not add to the first product before the first product is passed to the second digital signal processing unit.

16. The electronic device of claim 15, wherein the third adder receives the first product and adds the first product to zero.

17. The electronic device of claim 11, wherein the third digital signal processing unit comprises an output configured to output the dot product as an output of the electronic device.

18. A method manufacturing a dot-product-calculation integrated circuit, comprising:
organizing programmable circuitry into a dot product processing configuration to process dot products, wherein a dot product processing unit in the dot product processing configuration includes three or more digital signal processing blocks wherein the digital signal processing blocks each include a multiplier that generates a product based at least in part on respective inputs to the respective digital signal processing units; and
generating the integrated circuit with the dot product processing unit by locating the dot product processing unit in the integrated circuit, wherein generating the integrated circuit comprises:
placing a first digital signal processing unit of the three or more digital signal processing units that receives a first plurality of inputs, multiplies the first plurality of inputs together as a first product, and outputs the first product;
placing a second digital signal processing unit of the three or more digital signal processing units that receives a second plurality of inputs, multiplies the second plurality of inputs together as a second product, sums the first product and the second product as a first sum using an adder of the second digital signal processing unit, and outputs the first sum, wherein the first digital signal processing unit passes the first product to the second digital signal processing unit via a first dedicated route that passes the first product from the first digital signal processing unit to the second digital processing unit; and
placing a third digital signal processing unit of the three or more digital signal processing units that receives a third plurality of inputs, multiplies the third plurality of inputs together as a third product, adds the first sum and a second value together to form the dot product, and outputs the dot product, wherein the second value is based at least in part on the third plurality of inputs, and the second digital signal processing unit passes the second product to the third digital signal processing unit via a second dedicated route that passes the second product from the second digital signal processing unit to the third digital processing unit.

19. The method of claim 18, wherein placing the first, second, and third digital signal processing units comprises placing the first, second, and third digital signal processing units in a column with the first and second digital signal processing units to each other in the column and the second and third digital signal processing units to each other in the column.

20. The method of claim 18, wherein the first product is added to a zero value in an adder of the first processing unit before being passed to the second processing unit.

21. A method of configuring a series of digital signal processing units comprising:
configuring the digital signal processing units in the series of digital signal processing units to receive a plurality of inputs, wherein the digital signal processing units are configurably connected to perform a variety of operations on the plurality of inputs;
configuring at least one digital signal processing unit in the series of digital signal processing units to output results from operator circuitry to a respective digital signal processing unit in the series of digital signal processing units using a respective dedicated route of a plurality of dedicated routes between the series of digital signal processing units; and
configuring one of the digital signal processing units to output a dot product based at least in part on the results.

22. The method of claim 21, wherein the results comprise a first product output from a multiplier, the operator circuitry comprises the multiplier, and configuring the digital signal processing units comprises configuring the multiplier in the series of digital signal processing units to multiply the respective plurality of inputs together.

23. The method of claim 22, wherein the results comprise an addition in an adder, the operator circuitry comprises the adder, and configuring the digital signal processing units comprises configuring the adder in an adding digital signal processing unit of the series of digital signal processing units to receive the first product from a transmitting digital signal processing unit of the series of via a dedicated route of the plurality of dedicated routes and to add the first product to a second product from a multiplier in the adding digital signal processing unit.

24. Tangible, non-transitory, and computer-readable medium having instructions stored thereon that, when executed by a processor, are configured to cause the processor to configure a series of digital signal processing units, wherein the instructions are configured to cause the processor to:

configure the digital signal processing units in the series of digital signal processing units to receive a plurality of inputs, wherein the digital signal processing units are configurably connected to perform a variety of operations on the plurality of inputs;

configure at least one digital signal processing unit in the series of digital signal processing units to output results from operator circuitry to a respective digital signal processing unit in the series of digital signal processing units using a respective dedicated route of a plurality of dedicated routes between the series of digital signal processing units; and configure one of the digital signal processing units to output a dot product based at least in part on the results.

25. The tangible, non-transitory, and computer-readable medium of claim 24, wherein the results comprise a first product output from a multiplier, the operator circuitry comprises the multiplier, and configuring the digital signal processing units comprises configuring the multiplier in the series of digital signal processing units to multiply the respective plurality of inputs together.

26. The method of claim 25, wherein the results comprise an addition in an adder, the operator circuitry comprises the adder, and configuring the digital signal processing units comprises configuring the adder in an adding digital signal processing unit of the series of digital signal processing units to receive the first product from a transmitting digital signal processing unit of the series of via a dedicated route of the plurality of dedicated routes and to add the first product to a second product from a multiplier in the adding digital signal processing unit.

\* \* \* \* \*